United States Patent
Wang et al.

(10) Patent No.: US 11,038,088 B2
(45) Date of Patent: Jun. 15, 2021

(54) LIGHT EMITTING DIODE PACKAGE

(71) Applicant: Lextar Electronics Corporation, Hsinchu (TW)

(72) Inventors: Te-Chung Wang, Hsinchu (TW); Shiou-Yi Kuo, Hsinchu (TW)

(73) Assignee: Lextar Electronics Corporation, Hsinchu (TW)

( * ) Notice: Subject to any disclaimer, the term of this patent is extended or adjusted under 35 U.S.C. 154(b) by 0 days.

(21) Appl. No.: 16/600,577

(22) Filed: Oct. 14, 2019

(65) Prior Publication Data
US 2021/0111313 A1    Apr. 15, 2021

(51) Int. Cl.
| H01L 33/56 | (2010.01) |
| H01L 27/15 | (2006.01) |
| H01L 33/48 | (2010.01) |
| H01L 33/54 | (2010.01) |
| H01L 33/62 | (2010.01) |
| H01L 33/52 | (2010.01) |
| H01L 29/06 | (2006.01) |
| H01L 21/02 | (2006.01) |

(52) U.S. Cl.
CPC ........ *H01L 33/486* (2013.01); *H01L 21/0228* (2013.01); *H01L 29/0665* (2013.01); *H01L 33/52* (2013.01); *H01L 2924/12041* (2013.01)

(58) Field of Classification Search
CPC ... H01L 21/6835; H01L 33/44; H01L 33/486; H01L 33/52; H01L 33/56; H01L 2924/12041
See application file for complete search history.

(56) References Cited

U.S. PATENT DOCUMENTS

| 5,286,335 A | 2/1994 | Drabik et al. |
| 5,981,976 A | 11/1999 | Murasato |
| 6,613,610 B2 | 9/2003 | Iwafuchi et al. |
| 6,614,058 B2 | 9/2003 | Lin et al. |
| 6,791,119 B2 | 9/2004 | Slater et al. |
| 6,914,268 B2 | 7/2005 | Shei et al. |
| 7,199,390 B2 | 4/2007 | Wang et al. |
| 7,217,956 B2 | 5/2007 | Daniels et al. |
| 7,317,211 B2 | 1/2008 | Watanabe et al. |
| 8,048,696 B2 | 11/2011 | Shiue et al. |
| 8,207,547 B2 | 6/2012 | Lin |
| 8,309,979 B2 | 11/2012 | McKenzie et al. |
| 8,431,422 B2 | 4/2013 | Herrmann |
| 8,653,542 B2 | 2/2014 | Hsia |

(Continued)

FOREIGN PATENT DOCUMENTS

| JP | 6-45650 A | 2/1994 |
| JP | 2016213365 A | 12/2016 |
| JP | 2019079897 A | 5/2019 |

*Primary Examiner* — David C Spalla
(74) *Attorney, Agent, or Firm* — CKC & Partners Co., LLC

(57) ABSTRACT

A light emitting diode (LED) package includes a substrate, at least one micro LED chip, a black material layer, and a transparent material layer. The substrate has a width ranging from 100 micrometers to 1000 micrometers. The at least one micro LED chip is electrically mounted on a top surface of the substrate and has a width ranging from 1 micrometer to 100 micrometers. The black material layer covers the top surface of the substrate to expose the at least one micro LED chip. The transparent material layer covers the at least one micro LED chip and the black material layer.

14 Claims, 12 Drawing Sheets

(56) References Cited

U.S. PATENT DOCUMENTS

| | | |
|---|---|---|
| 8,723,158 B2 | 5/2014 | Jang et al. |
| 8,835,940 B2 | 9/2014 | Hu et al. |
| 8,865,489 B2 | 10/2014 | Rogers et al. |
| 8,931,906 B2 | 1/2015 | Huang et al. |
| 9,112,093 B2 | 8/2015 | Lim et al. |
| 9,142,741 B2 | 9/2015 | Shatalov et al. |
| 9,368,683 B1 | 6/2016 | Meitl et al. |
| 9,548,423 B2 | 1/2017 | Chien et al. |
| 9,640,715 B2 | 5/2017 | Bower et al. |
| 9,722,145 B2 | 8/2017 | Sasaki et al. |
| 9,947,835 B2 | 4/2018 | Seo et al. |
| 10,116,120 B2 | 10/2018 | Takeuchi et al. |
| 10,262,966 B2 | 4/2019 | Bower |
| 10,381,332 B2* | 8/2019 | Ulmer .................. H01L 25/0753 |
| 10,504,878 B2* | 12/2019 | Min .................... H01L 25/0753 |
| 10,811,567 B2* | 10/2020 | Lim ........................ H01L 33/62 |
| 2002/0145147 A1 | 10/2002 | Chiou et al. |
| 2004/0211972 A1 | 10/2004 | Du et al. |
| 2008/0142813 A1 | 6/2008 | Chang et al. |
| 2011/0210354 A1* | 9/2011 | Ichikawa ............. H01L 33/641 |
| | | 257/98 |
| 2012/0153304 A1 | 6/2012 | Schubert et al. |
| 2014/0084240 A1 | 3/2014 | Hu et al. |
| 2015/0115290 A1 | 4/2015 | Guenard |
| 2015/0140710 A1 | 5/2015 | McLaurin et al. |
| 2016/0254253 A1 | 9/2016 | Meitl et al. |
| 2016/0300745 A1 | 10/2016 | Chang et al. |
| 2017/0098735 A1 | 4/2017 | Huang et al. |
| 2017/0133818 A1 | 5/2017 | Cok |
| 2017/0250311 A1 | 8/2017 | Lin et al. |
| 2018/0033918 A1 | 2/2018 | Lin et al. |
| 2018/0078782 A1 | 3/2018 | Hsieh et al. |
| 2018/0204973 A1* | 7/2018 | Jeung ...................... H01L 33/32 |
| 2018/0226287 A1 | 8/2018 | Bower et al. |
| 2018/0277524 A1 | 9/2018 | Moon et al. |
| 2019/0019781 A1 | 1/2019 | Lebrun |
| 2019/0049760 A1 | 2/2019 | Hyun et al. |
| 2019/0051797 A1 | 2/2019 | Sung et al. |
| 2019/0067256 A1 | 2/2019 | Kurimoto |
| 2019/0164945 A1 | 5/2019 | Chae et al. |
| 2019/0165038 A1 | 5/2019 | Chae et al. |
| 2019/0165207 A1 | 5/2019 | Kim et al. |
| 2019/0189596 A1 | 6/2019 | Chae et al. |
| 2019/0214373 A1 | 7/2019 | Kim et al. |
| 2019/0252856 A1 | 8/2019 | Hirose et al. |
| 2019/0280158 A1 | 9/2019 | Sung et al. |
| 2019/0327827 A1* | 10/2019 | Chang ...................... H01L 33/62 |
| 2019/0355884 A1* | 11/2019 | Pan ......................... H01L 33/54 |
| 2019/0386176 A1 | 12/2019 | Wu et al. |
| 2019/0386180 A1 | 12/2019 | Hwang et al. |
| 2020/0153197 A1 | 5/2020 | Chen et al. |
| 2020/0161499 A1 | 5/2020 | Ota et al. |
| 2020/0212262 A1 | 7/2020 | Jang et al. |
| 2020/0212263 A1 | 7/2020 | Heo et al. |
| 2020/0212267 A1 | 7/2020 | Kwak et al. |
| 2020/0235267 A1 | 7/2020 | Cho et al. |
| 2020/0365647 A1 | 11/2020 | Jang et al. |
| 2020/0365649 A1 | 11/2020 | Jang et al. |

\* cited by examiner

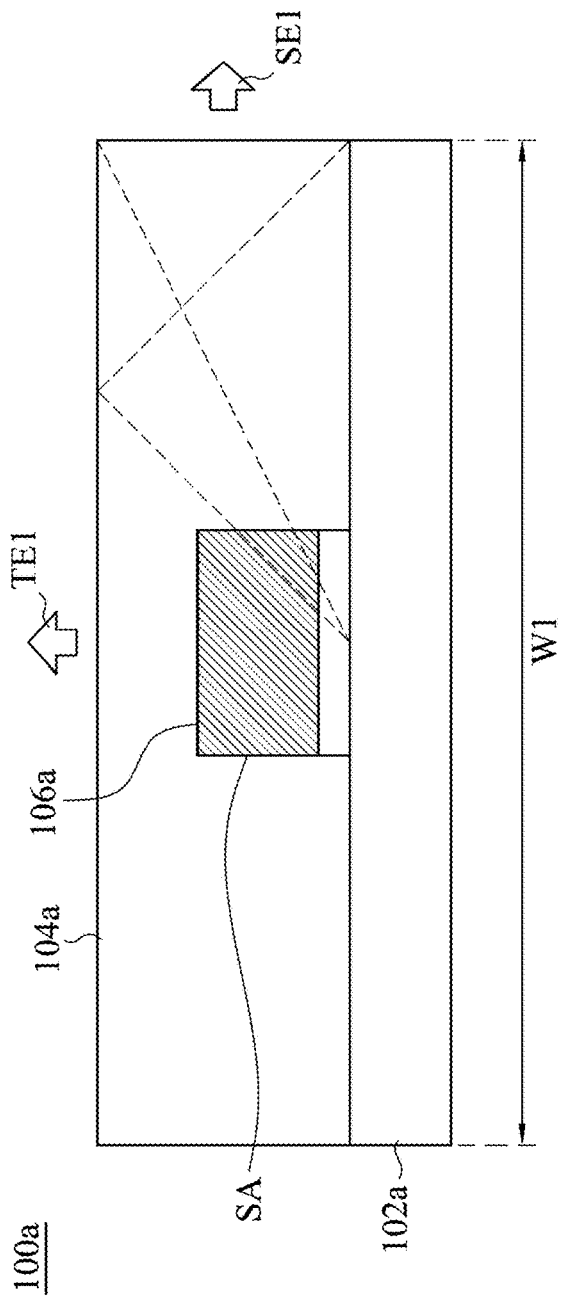
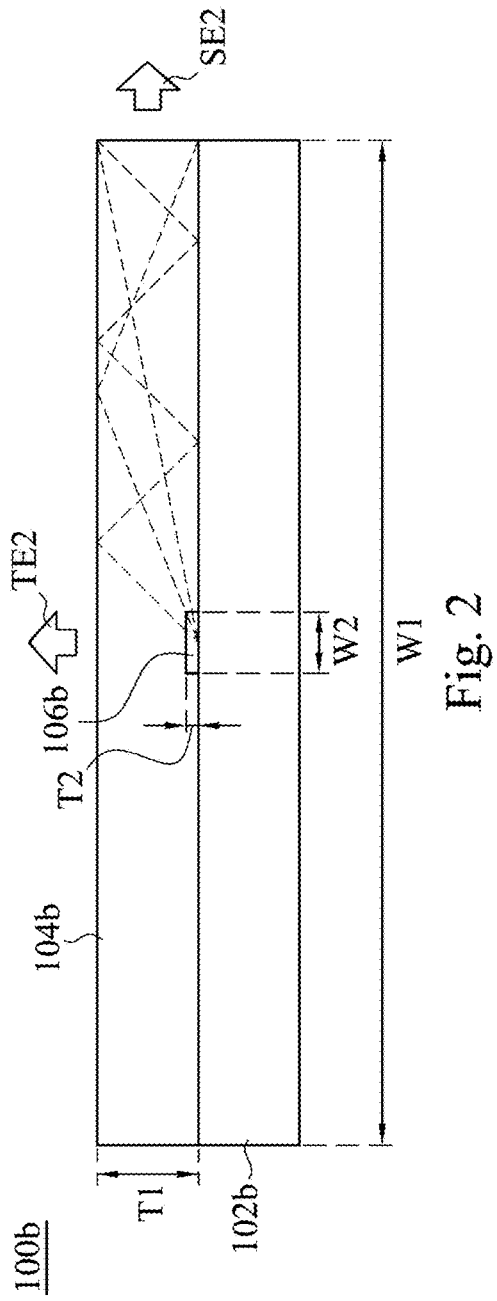

LIGHT EMITTING DIODE PACKAGE

CROSS-REFERENCE TO RELATED APPLICATION

This application is related to copending U.S. application Ser. No. 16/541,132 filed on Aug. 14, 2019, copending U.S. application Ser. No. 16/524,165 filed on Jul. 29, 2019 and copending U.S. application Ser. No. 16/524,202 filed on Jul. 29, 2019, all of which are incorporated by reference herein in their entireties and not admitted to be prior art with respect to the present invention by their mention in this cross-reference section.

BACKGROUND

Field of Invention

The present invention relates to a light emitting diode package.

Description of Related Art

It is known to use LED displays each including an array of red, green, and blue LED elements as pixels. Such LED displays offer light with higher luminance than the luminance of backlight-type liquid-crystal displays and are used for large-scale digital signage and other applications.

There is a demand for such LED displays to have high contrast ratios, but reflection of extraneous light may cause false lighting and reduce the contrast ratios in environments.

Therefore, there is a need to provide a light-emitting device that offers higher luminance and a higher contrast ratio.

SUMMARY

One aspect of the present invention provides a light emitting diode package. The light emitting diode package includes a substrate, at least one micro LED chip, a black material layer, and a transparent material layer. The substrate has a width ranging from 100 micrometers to 1000 micrometers. The at least one micro LED chip is electrically mounted on a top surface of the substrate and has a width ranging from 1 micrometer to 100 micrometers. The black material layer covers the top surface of the substrate to expose the at least one micro LED chip. The transparent material layer covers the at least one micro LED chip and the black material layer.

According to some embodiments of the present disclosure, the at least one micro LED chip has a thickness smaller than 10 micrometers.

According to some embodiments of the present disclosure, the black material layer includes a black photoresist having a reflectivity smaller than 10%.

According to some embodiments of the present disclosure, the at least one micro LED chip has a thickness substantially equal to that of the black material layer.

According to some embodiments of the present disclosure, the at least one micro LED chip comprises a light emitting surface having a first area, the top surface of the substrate has a second area, a ratio of the first area to the second area is smaller than 5%.

According to some embodiments of the present disclosure, the transparent material layer has a thickness smaller than 100 micrometers.

According to some embodiments of the present disclosure, a ratio of the width of the substrate to the thickness of the transparent material layer is equal to or greater than 4.

According to some embodiments of the present disclosure, the transparent material layer has an optical transmittance greater than or equal to 90%, 92%, or 95%.

According to some embodiments of the present disclosure, the transparent material layer has a top texture surface.

According to some embodiments of the present disclosure, the at least one micro LED chip includes a first semiconductor layer with a light emitting surface exposed outside and the light emitting surface has a rough texture; a light emitting layer disposed on the first semiconductor layer; a second semiconductor layer disposed on the light emitting layer, wherein the second semiconductor layer has a type that is different from the first semiconductor layer; and a supporting breakpoint on the light emitting surface.

According to some embodiments of the present disclosure, the transparent material layer is a transparent dielectric layer or a transparent resin layer.

Another aspect of the present invention provides a light emitting diode (LED) package. The light emitting diode package includes a substrate, at least one micro LED chip, and a transparent material layer. The at least one micro LED chip is electrically mounted on a top surface of the substrate. The transparent material layer covers the at least one micro LED chip and has a thickness, wherein a ratio of a width of the substrate to the thickness of the transparent material layer is equal to or greater than 4.

According to some embodiments of the present disclosure, the light emitting diode package further includes a black material layer covering the top surface of the substrate and exposing the at least one micro LED chip.

According to some embodiments of the present disclosure, the at least one micro LED chip has a thickness smaller than 10 micrometers, and the transparent material layer has a thickness smaller than 100 micrometers.

According to some embodiments of the present disclosure, the width of the substrate ranges from 400 micrometers to 1000 micrometers.

According to some embodiments of the present disclosure, the black material layer comprises a black photoresist having a reflectivity smaller than 10%.

According to some embodiments of the present disclosure, the transparent material layer is a transparent dielectric layer or a transparent resin layer.

According to some embodiments of the present disclosure, the transparent dielectric layer includes $SiO2$, $Al_2O_3$, $TiO2$, $Ta2O5$, $HfO2$, $ZrO2$, $Y_2O_3$, $MgF2$ or $Si3N4$.

According to some embodiments of the present disclosure, the transparent dielectric layer is formed by a chemical vapor deposition process or an atomic layer deposition process.

According to some embodiments of the present disclosure, the at least one micro LED chip includes a first semiconductor layer with a light emitting surface exposed outside and the light emitting surface has a rough texture; a light emitting layer disposed on the first semiconductor layer; a second semiconductor layer disposed on the light emitting layer, wherein the second semiconductor layer has a type that is different from the first semiconductor layer; and a supporting breakpoint on the light emitting surface.

BRIEF DESCRIPTION OF THE DRAWINGS

The invention can be more fully understood by reading the following detailed description of the embodiment, with reference made to the accompanying drawings as follows:

FIG. 1 illustrates a cross-sectional view of a typical light emitting diode package.

FIGS. 2-5 illustrate cross-sectional views of light emitting diode packages in accordance with embodiments of the present invention.

DETAILED DESCRIPTION

Figure 3:
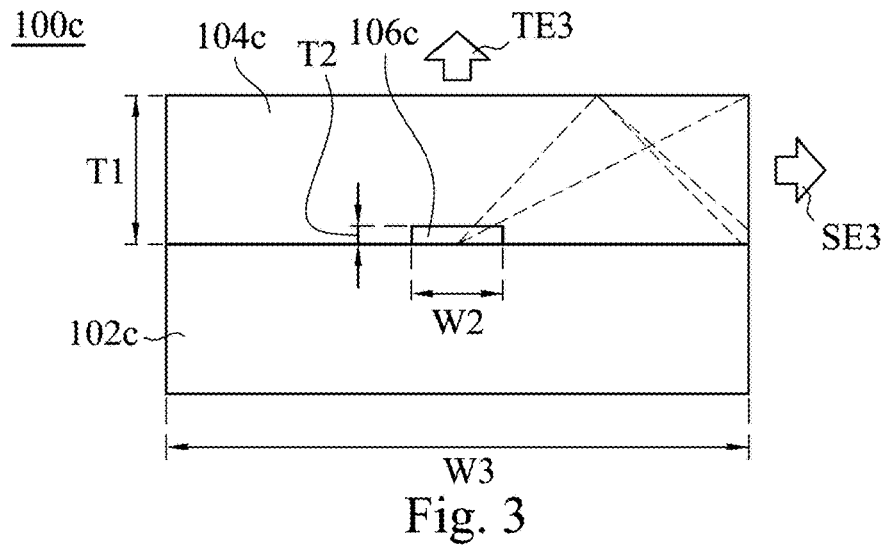

The present disclosure is described by the following specific embodiments. Those with ordinary skill in the arts can readily understand the other advantages and functions of the present invention after reading the disclosure of this specification. The present disclosure can also be implemented with different embodiments. Various details described in this specification can be modified based on different viewpoints and applications without departing from the scope of the present disclosure.

The following embodiments are disclosed with accompanying diagrams for detailed description. For illustration clarity, many details of practice are explained in the following descriptions. However, it should be understood that these details of practice do not intend to limit the present invention. That is, these details of practice are not necessary in parts of embodiments of the present invention. Furthermore, for simplifying the drawings, some of the conventional structures and elements are shown with schematic illustrations.

FIG. 1 illustrates a cross-sectional view of a typical light emitting diode package. A LED package 100a includes a substrate 102a, at least one mini LED chip 106a and a transparent material layer 104a. The mini LED chip 106a conventionally includes a sapphire substrate SA. The transparent material layer 104a covers the at least one mini LED chip 106a and the substrate 102a. In this embodiment, the substrate 102a has a width W1 ranging from 100 micrometers to 1000 micrometers. The mini LED chip 106a has a width ranging from 100 micrometers to 250 micrometers.

In an embodiment A of a package width of 1000 micrometers (i.e., the substrate 102a has a width of 1000 micrometers), a LED chip 106a with a thickness of 150 micrometers and a width of 225 micrometers, and a transparent glue layer (e.g., 104a) with a thickness equal to or greater than 250 micrometers, but no black material is covered over the substrate 102a, the LED chip 106a may emit to enable the package 100a to achieve a 18% ratio of a side emission SE1 to a top emission TE1. In this embodiment, a ratio of the width (W1) of the substrate 102a to a thickness of the transparent material layer 104a is smaller than 4.

As shown in FIG. 2, a LED package 100b includes a substrate 102b, at least one micro LED chip 106b and a transparent material layer 104b. In this embodiment, the substrate 102b has a width W1 ranging from 100 micrometers to 1000 micrometers. The substrate 102b is used to package a micro LED chip 106b having a width W2 ranging from 1 micrometers to 100 micrometers and a thickness T2 smaller than 10 micrometers, instead of a mini LED chip, e.g., 106a. The transparent material layer 104b covers the at least one micro LED chip 106b and the substrate 102b.

In certain embodiments, the substrate 102b has a width W1 ranging from 100 to 200 micrometers, from 200 to 500 micrometers, from 500 to 750 micrometers, or from 750 to 1000 micrometers.

In certain embodiments, the micro LED chip 106b has a width W2 ranging from 1 micrometer to 100 micrometers, e.g., from 1 to 5 micrometers, from 5 to 10 micrometers, from 10 to 25 micrometers, or from 25 to 50 micrometers.

In an embodiment B of a package width of 1000 micrometers (i.e., the substrate 102b has a width of 1000 micrometers), a LED chip 106b with a thickness of 10 micrometers and a width of 50 micrometers, and a transparent glue layer (e.g., 104b) with a thickness T1 of 100 micrometers, but no black material is covered over the substrate 102b, the LED chip 106b may emit to enable the package 100b to achieve a 5% ratio of a side emission SE2 to a top emission TE2.

Comparing the embodiments A and B, the side emission in embodiment B is reduced because the micro LED chip 106b is used to replace the mini LEP chip 106a in the package and the transparent glue layer is downsized in its thickness, thereby increasing an internal reflection within the transparent glue layer.

As shown in FIG. 3, a LED package 100c includes a substrate 102c, at least one micro LED chip 106c and a transparent material layer 104c. In this embodiment, the substrate 102c has a width W3 ranging from 100 micrometers to 1000 micrometers. The substrate 102c is used to package a micro LED chip 106c having a width W2 ranging from 1 micrometers to 100 micrometers and a thickness T2 smaller than 10 micrometers. The transparent material layer 104c covers the at least one micro LED chip 106c and the substrate 102c.

In an embodiment C of a package width of 400 micrometers (i.e., the substrate 102c has a width of 400 micrometers), a LED chip 106c with a thickness of 10 micrometers and a width of 50 micrometers, and a transparent glue layer (e.g., 104c) with a thickness T1 of 100 micrometers, but no black material is covered over the substrate 102c, the LED chip 106c may emit to enable the package 100c to achieve a 10% ratio of a side emission SE3 to a top emission TE3.

Comparing the embodiments B and C, the side emission in embodiment C is increased because the package or the substrate 102c is downsized in its width to reduce an internal reflection within the transparent glue layer.

Figure 4:
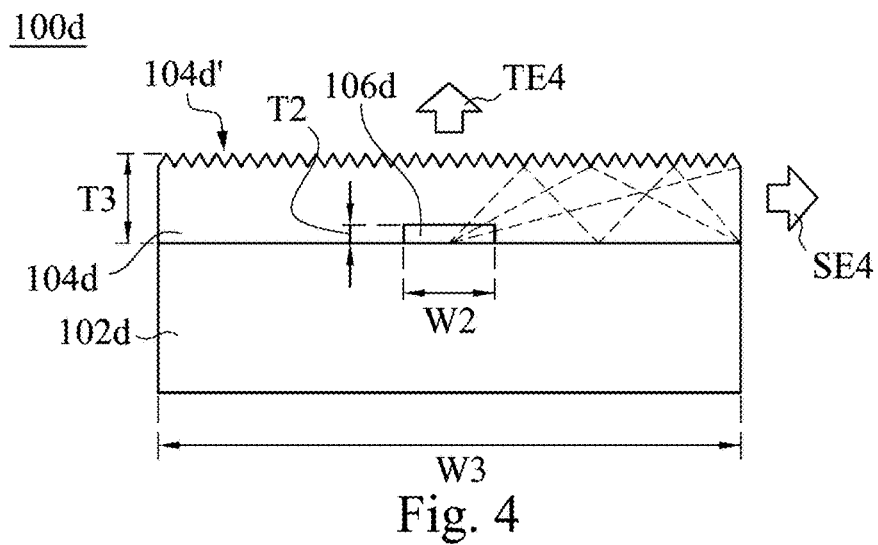

As shown in FIG. 4, a LED package 100d includes a substrate 102d, at least one micro LED chip 106d and a transparent material layer 104d. In this embodiment, the substrate 102d has a width W3 ranging from 100 micrometers to 1000 micrometers. The substrate 102d is used to package a micro LED chip 106d having a width ranging from 1 micrometer to 100 micrometers and a thickness T2 smaller than 10 micrometers. The transparent material layer 104d covers the at least one micro LED chip 106d and the substrate 102d.

In an embodiment D of a package width of 400 micrometers (i.e., the substrate 102d has a width of 400 micrometers), a LED chip 106d with a thickness of 10 micrometers and a width of 50 micrometers, and a transparent glue layer (e.g., 104d) with a thickness T3 of 50 micrometers, but no black material is covered over the substrate 102d, the LED chip 106d may emit to enable the package 100d to achieve a 4% ratio of a side emission SE4 to a top emission TE4.

Comparing the embodiments C and D, the side emission in embodiment D is reduced because the transparent glue layer 104d is downsized in its thickness to further increase an internal reflection within the transparent glue layer.

As shown in FIG. 4, the at least one micro LED chip 106e has a thickness substantially equal to that of the black material layer 108, but not being limited thereto.

In other embodiments, the transparent glue layer 104d may have a top text surface 104d' to further increase the top emission TE4 for the LED package 100d.

Figure 5:
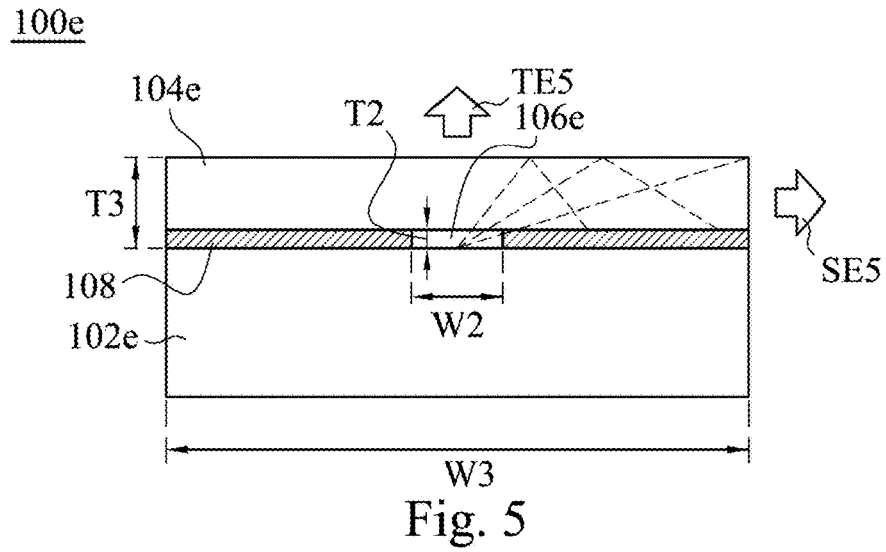

As shown in FIG. 5, a LED package 100e includes a substrate 102e, at least one micro LED chip 106e, a black material layer 108 and a transparent material layer 104e. In this embodiment, the substrate 102e has a width W3 ranging from 100 micrometers to 1000 micrometers. The substrate 102e is used to package a micro LED chip 106e having a width ranging from 1 micrometer to 100 micrometers and a thickness smaller than 10 micrometers. The black material layer 108 is configured to cover a top surface of the substrate 102e and expose a light-emitting surface of the at least one micro LED chip 106a. The black material layer 108 preferably has a thickness less than 10 micrometers.

In an embodiment E of a package width of 400 micrometers (i.e., the substrate 102e has a width of 400 micrometers), a LED chip 106e with a thickness of 10 micrometers and a width of 50 micrometers, a black material layer 108 with a thickness 3 micrometers and a reflectivity smaller than 10%, and a transparent glue layer (e.g., 104e) with a thickness T3 of 50 micrometers, the LED chip 106e may emit to enable the package 100e to achieve a 0.4% ratio of a side emission SE5 to a top emission TE5. In this embodiment, the black material layer 108 may be a black photoresist having a reflectivity smaller than 10%, but not being limited thereto.

Comparing the embodiments D and E, the side emission in embodiment E is further reduced because the black material layer 108 is added to reduce internal reflection within the transparent material layer 104e.

In embodiments B-E, the transparent material layer may have an optical transmittance greater than or equal to 90%, 92%, or 95%, and have a thickness smaller than 100 micrometers, but not being limited thereto.

In embodiments B-E, a ratio of the width (W1, W3) of the substrate (102a-102e) to the thickness (T1, T3) of the transparent material layer (104a-104e) is equal to or greater than 4 to suppress the side emission from the LED package such that the ratio of the side emission to the top emission can be reduced.

In embodiments B-E, a width of a LED chip may be referred as a longer edge of the LED chip or any edge of the LED chip in a square shape while a width of a substrate may be referred as a longer edge of the substrate or any edge of the substrate in a square shape, but not being limited thereto.

In embodiments B-E, the at least one LED chip may include multiple LED chips configured to emit different color lights, e.g., red, green, blue lights, but not being limited thereto. Further, by adding cyan or yellow to the red, green, and blue micro LED, it can broaden the color gamut.

Figure 6:
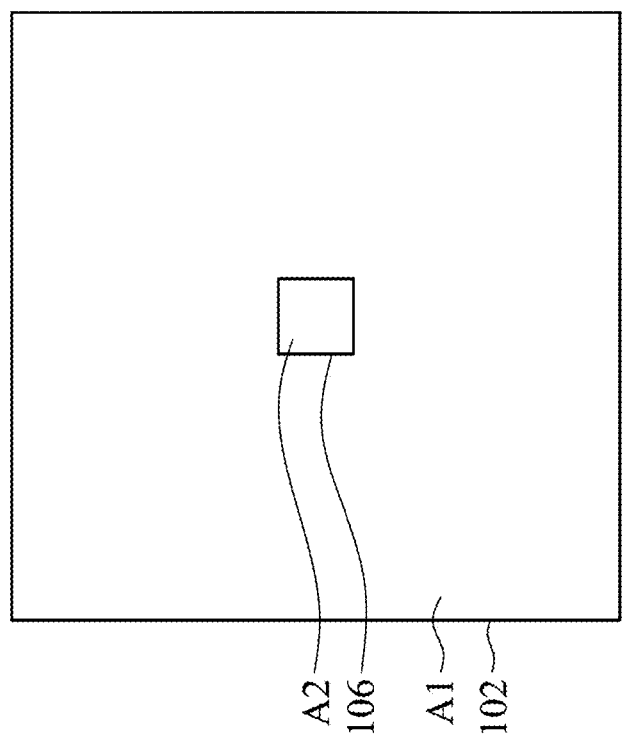
FIG. 6 illustrates a top view of the light emitting diode package in accordance with another embodiment of the present invention.

FIG. 6 illustrates a top view of a light emitting diode package in accordance with another embodiment of the present invention. The light emitting diode package includes a substrate 102 and at least one LED chip 106 electrically mounted on a top surface of the substrate 102. The substrate 102 has a top surface with an area A1 while the LED chip 106 has its light emitting surface with an area A2. A ratio of the area A2 to the area A1 is preferably equal to or less than 5% to enhance the contrast ratio for the LED package such that the ratio of the side emission to the top emission can be reduced. For example, the ratio of the area A2 to the area A1 is 1% in embodiment B; the ratio of the area A2 to the area A1 is 5% in embodiments C, D, and E. In embodiments B-E, at least one LED chip 106 may be multiple LED chips, e.g., red, green, and blue LED chips, and the area A2 may be referred as a total sum area of the light emitting surfaces of all the LED chips. In case the top surface of the substrate 102 is fully covered by the black material layer 108 except the light emitting surface of the LED chip 106, the ratio of the side emission to the top emission may be further reduced, the contrast ratio may be further enhanced, and extraneous light may not be reflected to cause false lighting.

The ratio of the side emission to the top emission, as discussed in previous embodiments, is reduced to improve crosstalk issues between pixels on the LED display panel.

Figure 7:
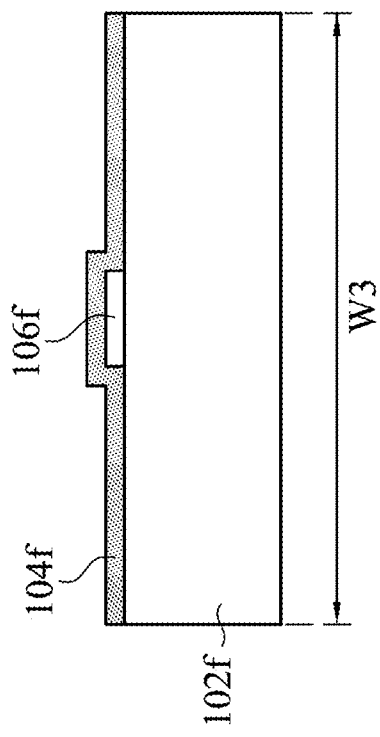
FIG. 7 illustrates a cross-sectional view of a light emitting diode package in accordance with another embodiment of the present invention.

FIG. 7 illustrates a cross-sectional view of a light emitting diode package 100f in accordance with another embodiment of the present invention. The LED package 100f includes a substrate 102f, at least one micro LED chip 106f and a transparent material layer 104f. In this embodiment, the transparent material layer 104f is a transparent dielectric layer instead of a transparent glue layer, e.g., a transparent resin layer. The transparent dielectric layer may be formed by a chemical vapor deposition process or an atomic layer deposition process, but not being limited thereto. The transparent dielectric layer may be $SiO_2$, $Al_2O_3$, $TiO_2$, $Ta_2O_5$, $HfO_2$, $ZrO_2$, $Y_2O_3$, $MgF_2$ or $Si_3N_4$, but not being limited thereto. The transparent dielectric layer, formed by a chemical vapor deposition process or an atomic layer deposition process, may have a thickness ranging from 0.1 micrometer to 10 micrometers, e.g., from 0.1 to 2 micrometers, from 2 to 4 micrometers, from 4 to 6 micrometers, or from 6 to 10 micrometers such that it can be conformal over upper surfaces of the micro LED chip 106f and the substrate 102f. In other embodiments, a black material layer, e.g., 108 in FIG. 5, may be added to cover a top surface of the substrate 102f and expose a light-emitting surface of the at least one micro LED chip 106f, and be covered by the transparent material layer 104f.

Figure 8:
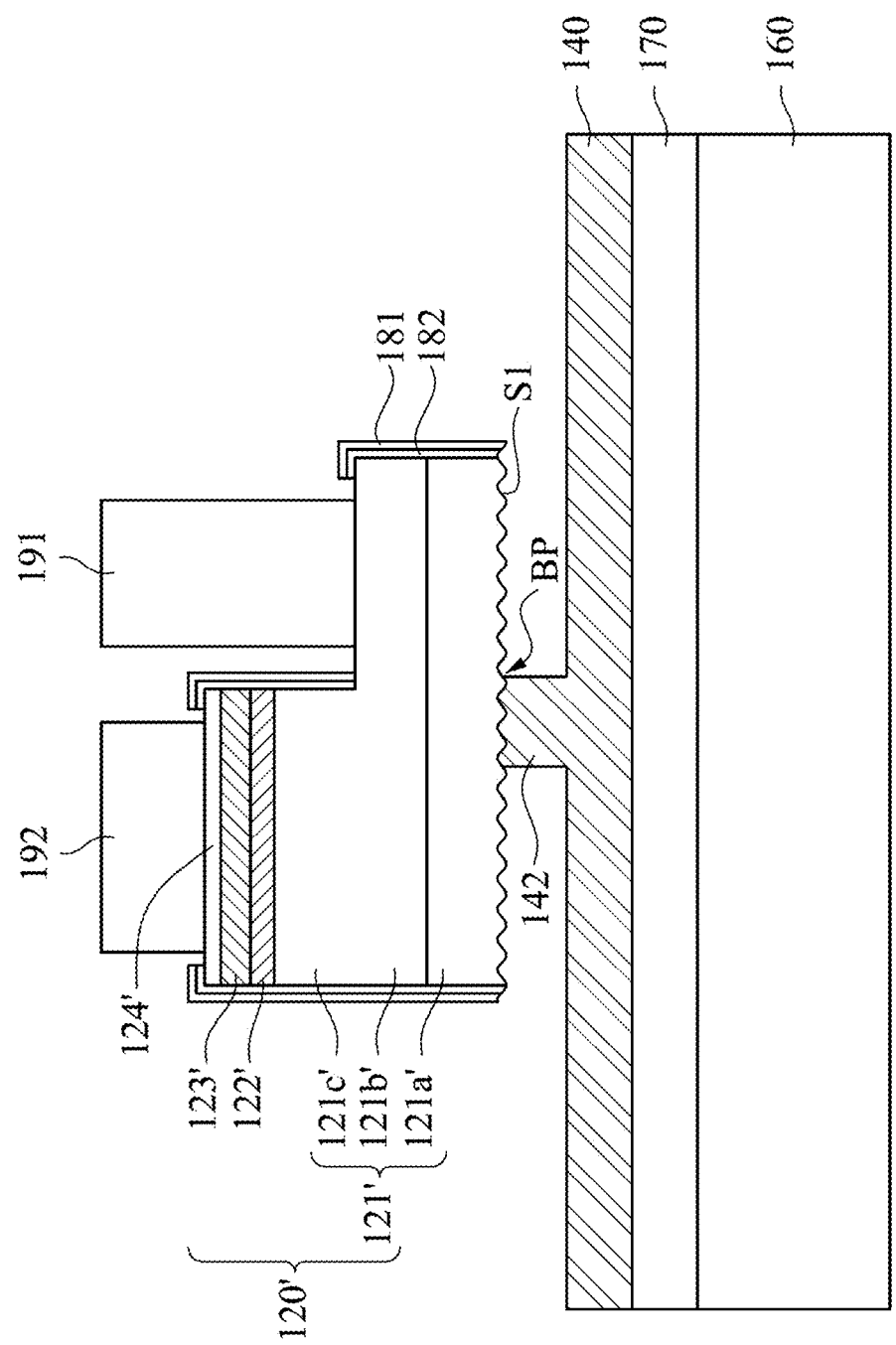
FIG. 8 illustrates a cross-sectional view of a micro LED chip in accordance with another embodiment of the present invention.
Figure 16:
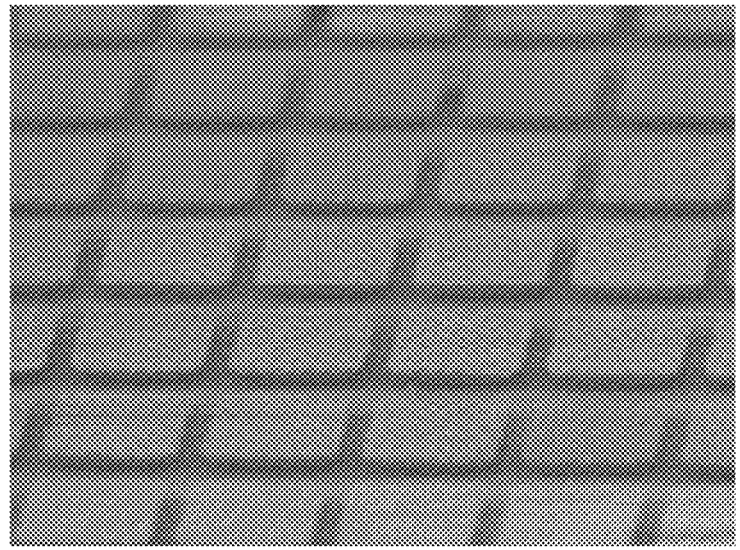
FIG. 16 is a photo of micro LED chip arrays of which each chip is equipped with a laser-lift-off rough pattern.
Figure 17:
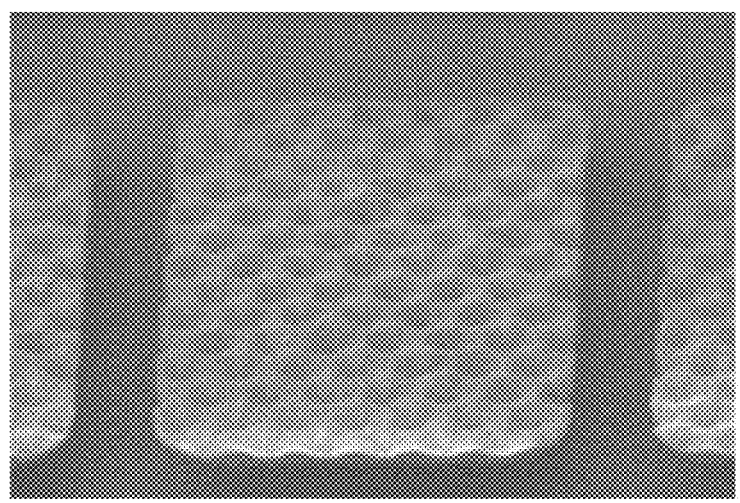
FIG. 17 is a photo of a top surface of a micro LED chip equipped with a laser-lift-off rough pattern.

FIG. 8 illustrates a cross-sectional view of a micro LED chip in accordance with another embodiment of the present invention. The micro LED chip includes a semiconductor stack 120' and a supporting breakpoint BP. The semiconductor stack 120' includes a first semiconductor layer 121', a light emitting layer 122', and a second semiconductor layer 123'. The first semiconductor layer 121' has a light emitting surface S1 exposed outside and the light emitting surface S1 has a rough texture. The light emitting surface S1 is formed by applying a laser lift off process to a sapphire substrate or patterned sapphire substrate to obtain a laser-lift-off rough pattern. Please see photos in FIGS. 16-17 for a laser-lift-off rough pattern, i.e., uniform round or hexagonal concaves, on a patterned sapphire substrate. Therefore, the micro LED chip is not equipped with the sapphire substrate or patterned sapphire substrate, but equipped with the laser-lift-off rough pattern to enhance light extraction. Specifically, the LED chip may emit a light passed through the light emitting surface S1. The supporting breakpoint BP is on the light emitting surface S1. In some embodiments, the first semiconductor layer 121' includes doped semiconductor layers 121b', 121c' and an undoped semiconductor layer 121a', and the light emitting surface S1 is on the undoped semiconductor layer 121a'. The doped semiconductor layers 121b', 121c' are between the light emitting layer 122' and the undoped semiconductor layer 121a'. In some embodiments, the LED chip further includes a first conductive pad 191 and a second conductive pad 192. The first conductive pad 191 is electrically connected to the first semiconductor layer 121', and the second conductive pad 192 is electrically connected to the second semiconductor layer 123'. In some embodiments, the LED chip further includes a conductive contact layer 124' between the second conductive pad 192 and the second semiconductor layer 123'. A sacrificial layer 140 is formed on the light emitting surface S1 of the semiconductor stack 120'. The sacrificial layer 140 is etched to form a supporter 142 protruded from a base portion thereof. A carrier substrate 160 is formed over the sacrificial layer 140. In some embodiments, an adhesive layer 170 may be formed between the sacrificial layer 140 and the carrier substrate 160. The carrier substrate 160 can be adhered to the sacrificial layer 140 by the adhesive layer 170 to enhance an adhesion therebetween. A sidewall leakage reduction layer 182 is formed over a sidewall of the semiconductor stack 120' by an atomic layer deposition process. Thus, the sidewall leakage reduction layer 182 reduces sidewall leakage effect and increases external quantum efficiency (EQE). In this embodiment, the sidewall leakage reduction layer 182 may be formed from $Al_2O_3$ or $SiO_2$, but not being limited thereto.

A bottom mirror layer 181 is formed over an outer surface of the sidewall leakage reduction layer 182 to enhance light extraction via the light emitting surface S1. In this embodiment, the bottom mirror layer 181 may be a distributed Bragg reflector (DBR) formed from alternately layers of $SiO_2$ and $TiO_2$, but not being limited thereto.

The semiconductor stack 120' can be separated from the carrier substrate 160. e.g., a sapphire substrate, when the carrier substrate 160 is removed by breaking the supporting breakpoint BP. A detailed process for manufacturing the LED chip can be cross-referenced to the specifications of U.S. application Ser. No. 16/524,202 filed on Jul. 29, 2019.

Figure 9:
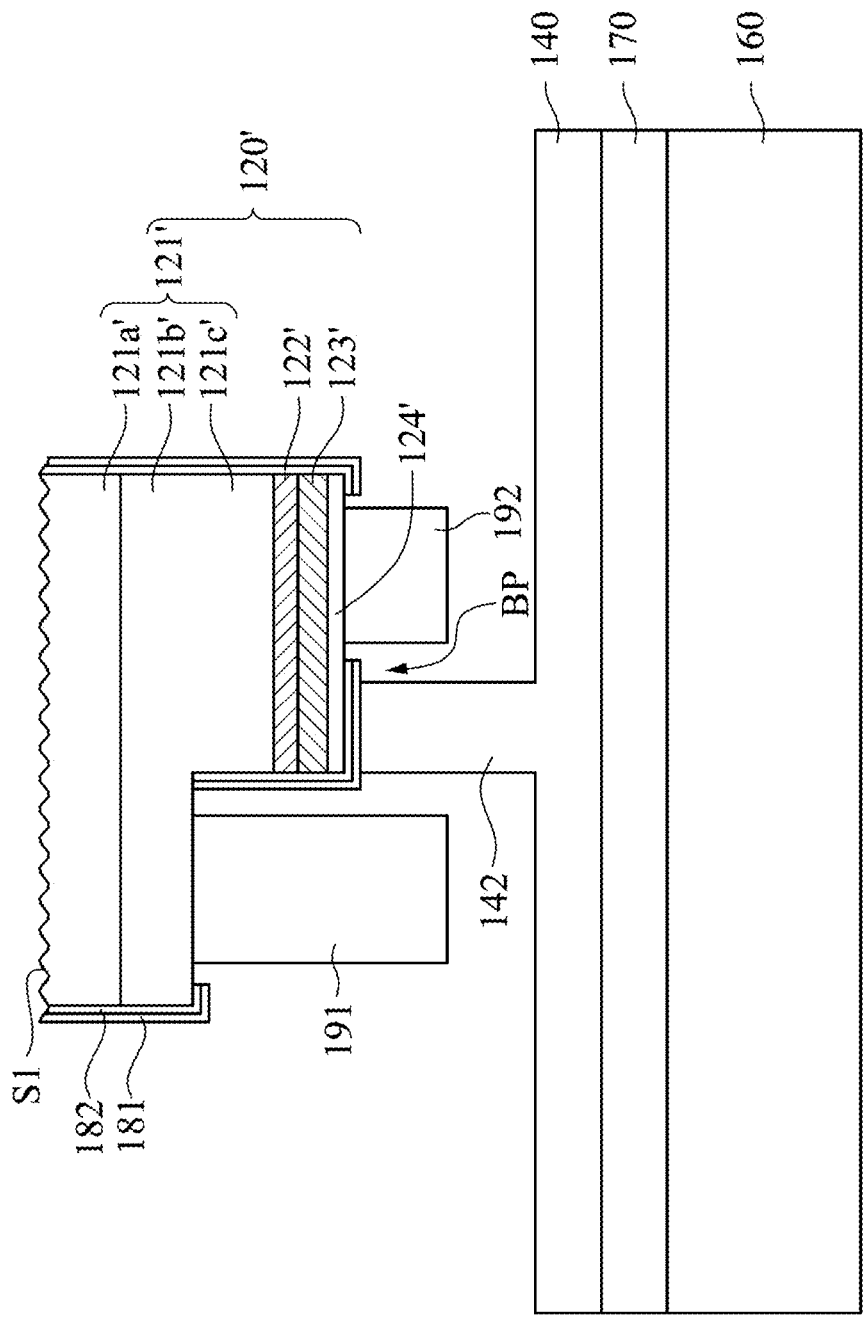
FIG. 9 illustrates a cross-sectional view of a micro LED chip in accordance with still another embodiment of the present invention.

FIG. 9 illustrates a cross-sectional view of a micro LED chip in accordance with still another embodiment of the present invention. The semiconductor structure in this embodiment is different from that of FIG. 8 in that the supporting breakpoint BP is on a surface of the semiconductor stack 120' that is opposite to the light emitting surface S1. The light emitting surface S1 is formed by applying a laser lift off process to a sapphire substrate or patterned sapphire substrate to obtain a laser-lift-off rough pattern. Therefore, the micro LED chip is not equipped with the sapphire substrate, but equipped with the laser-lift-off rough pattern to enhance light extraction.

Figure 14:
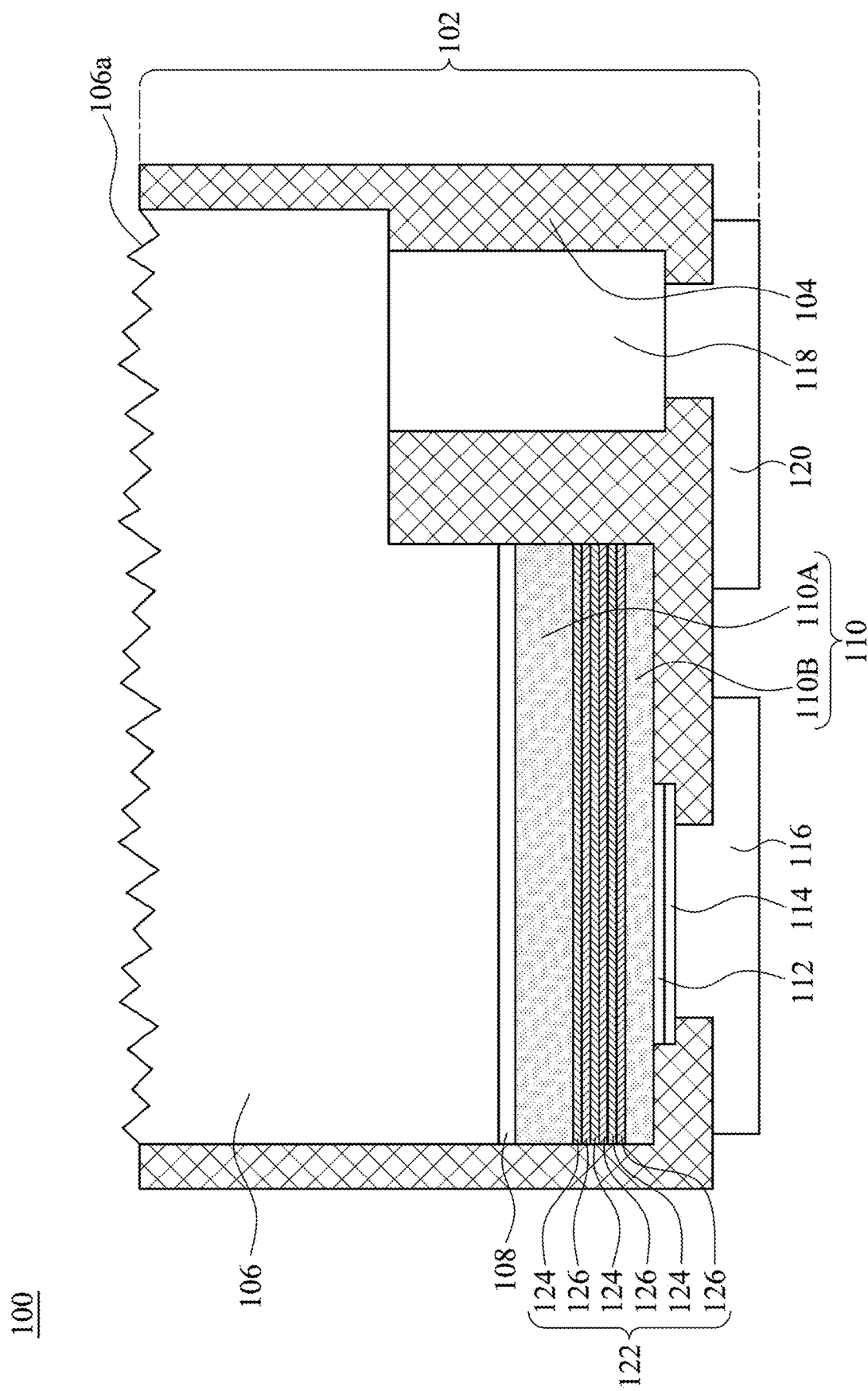
FIG. 14 illustrates a cross-sectional view of a light emitting device according in accordance with another embodiment of the present invention.

In other embodiments, the micro LED chips (106b-106f) may include the light emitting devices (100, 100a, 100b, 100c) as described in the specifications of U.S. application Ser. No. 16/524,165 filed on Jul. 29, 2019. For example, FIG. 14 illustrates the light emitting device 100 as disclosed in FIG. 1 of U.S. application Ser. No. 16/524,165. The light emitting device 100 has a stacked structure 102 and a first insulating layer 104 covering at least side surfaces of the stacked structure 102. The stacked structure 102 includes a p-type semiconductor layer 106, an n-type semiconductor layer 110, and a light emitting layer 108. The n-type semiconductor layer 110 is on the p-type semiconductor layer 106. The light emitting layer 108 is sandwiched between the p-type semiconductor layer 106 and the n-type semiconductor layer 110. In some embodiments, the p-type semiconductor layer 106 is a p-type GaP layer, and the n-type semiconductor layer 110 is an n-type AlGaInP layer. The stacked structure 102 further includes an n-type electrode 114, an n-type contact layer 112, a p-type electrode 118, an n-type contact pad 116, and a p-type contact pad 120. The n-type electrode 114 is on the n-type semiconductor layer 110. The n-type contact layer 112 is sandwiched between the n-type semiconductor layer 110 and the n-type electrode 114. The n-type contact pad 116 is on the n-type electrode 114. The p-type electrode 118 is on the p-type semiconductor layer 106. The p-type contact pad 120 is on the p-type electrode 118. In some embodiments, the n-type contact layer 112 is an n-type GaAs layer. In some embodiments, the light emitting layer 108 is a multiple quantum well active layer. In an embodiment, the multiple quantum well active layer is formed of alternating layers of a well layer and a barrier layer. In some embodiments, the light emitting layer 108 emits red light and the light emitting device 100 is a red light emitting device. The stacked structure 102 further includes a semiconductor reflector 122 between the light emitting layer 108 and the n-type contact layer 112. In some embodiments, the n-type semiconductor layer 110 has a first portion 110A and a second portion 110B spaced apart from the first portion 110A by the semiconductor reflector 122. The second portion 110B of the n-type semiconductor layer 110 is closer to the n-type contact layer 112 than the first portion 110A of the n-type semiconductor layer 110. A normal projection of the light emitting layer 108 onto the second portion 110B of the n-type semiconductor layer 110 overlaps a normal projection of the semiconductor reflector 122 onto the second portion 110B of the n-type semiconductor layer 110. The semiconductor reflector 122 can reflect light which is generated in the light emitting layer 108. In particular, the semiconductor reflector 122 can prevent the n-type contact layer 112 from absorbing light which is generated in the light emitting layer 108, thereby enhancing the light emission efficiency of the light emitting device 100. In other words, the semiconductor reflector 122 can redirect the light from passing downwards (i.e., in a direction toward the n-type contact layer 112) to passing upwards (in a direction toward the p-type semiconductor layer 106). In some embodiments, the semiconductor reflector 122 is a distributed Bragg reflector (DBR). The semiconductor reflector 122 includes multiple periods. Each period includes at least a first layer 124 and at least a second layer 126. A refractive index of the first layer 124 is different from a refractive index of the second layer 126. The first layer 124 and the second layer 126 of the semiconductor reflector 122 include aluminum in some embodiments. The refractive index of the first layer 124 and the refractive index of the second layer 126 depend on the atomic percentage of the aluminum therein. For example, the first layer 124 of the semiconductor reflector 122 includes $Al_xGa_{1-x}As$, in which $0<x<1$. The second layer 126 of the semiconductor reflector 122 includes $Al_yGa_{1-y}As$, in which $0<y<1$ and y is different from x. That is to say, an atomic percentage of the aluminum in the first layer 124 is substantially different from an atomic percentage of the aluminum in the second layer 126. In some embodiments, the first insulating layer 104 covers a bottom surface of the stacked structure 102 and exposes a bottom part of the n-type contact pad 116 and a bottom part of the p-type contact pad 120. The first insulating layer 104 has a refractive index less than a refractive index of the p-type semiconductor layer 106 such that light extraction efficiency can be improved by the first insulating layer. The p-type semiconductor layer 106 has a top surface 106a facing away from the semiconductor reflector 122. The top surface 106a of the p-type semiconductor layer 106 has irregularities. In other words, the top surface 106a of the p-type semiconductor layer 106 is a rough surface, thereby improving the light extraction efficiency of the light emitting device 100 by reducing loss due to total internal reflection (TIR) between air and the top surface 106a of the p-type semiconductor layer 106.

Figure 15:
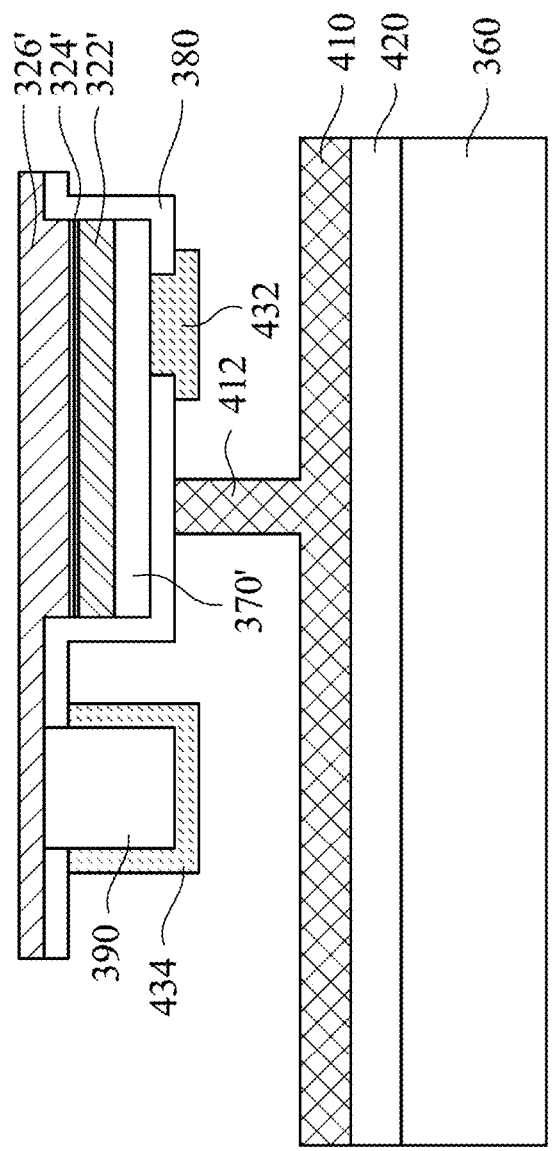
FIG. 15 illustrates a cross-sectional view of a light emitting diode structure according in accordance with another embodiment of the present invention.

In other embodiments, the micro LED chips (106b-106f) may include the light emitting diode structures (10, 20, 30) as described in the specifications of U.S. application Ser. No. 16/541,132 filed on Aug. 14, 2019. For example, FIG. 15 illustrates a light emitting diode structure as disclosed in FIG. 50 of U.S. application Ser. No. 16/541,132. Process steps for manufacturing the light emitting diode structure can be referred to FIGS. 39 to 49 of U.S. application Ser. No. 16/541,132.

Figure 10:
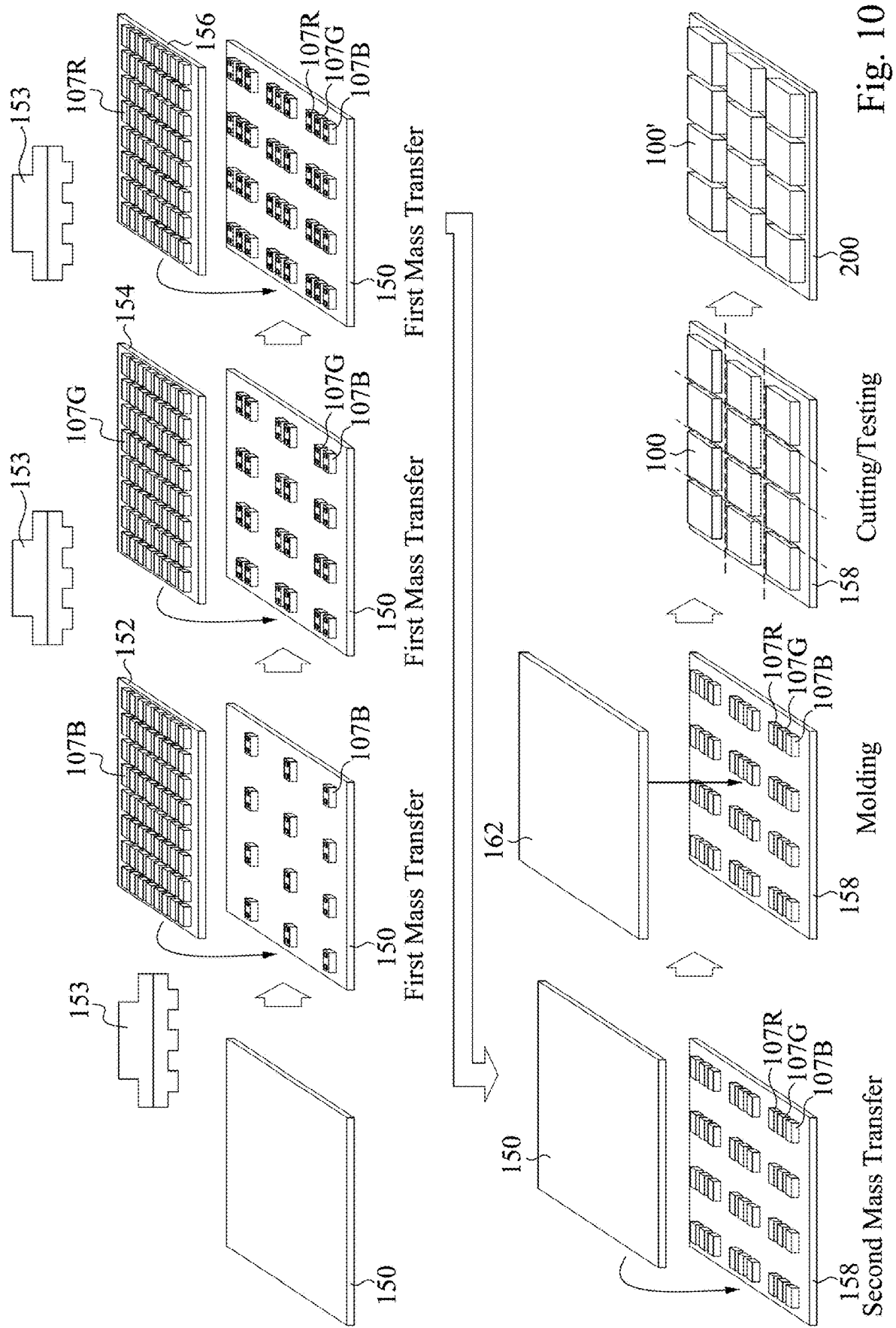
FIGS. 10-11 illustrate steps of manufacturing a light emitting diode display panel in accordance with one embodiment of the present invention.
Figure 11:
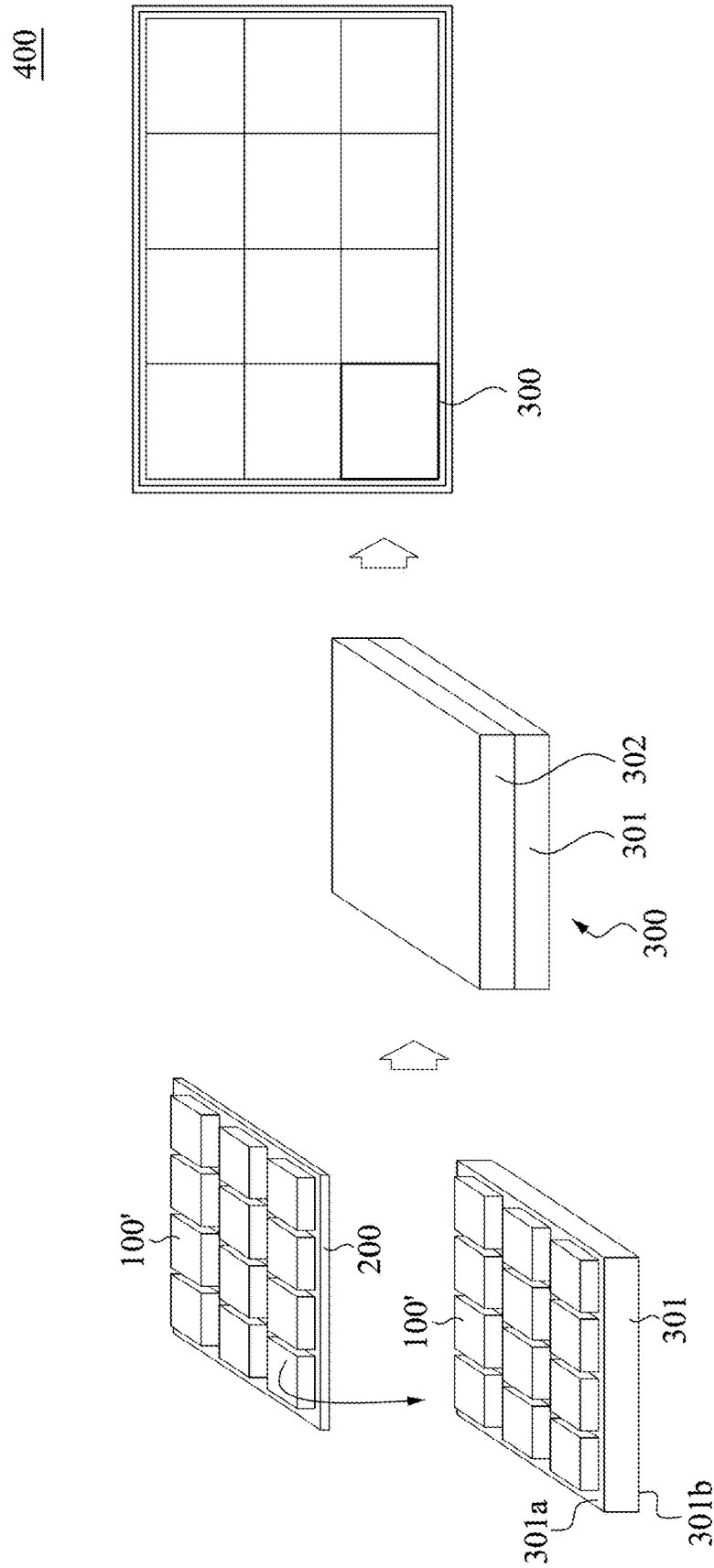

FIGS. 10-11 illustrate steps of manufacturing a light emitting diode display panel using the light emitting diode chip in FIG. 8. As shown in FIG. 9, after micro LED chips, e.g., blue LED chips 107B, green LED chips 107G, and red LED chips 107R, are manufactured on their respective substrates (152, 154, 156), a temporary substrate 150 is used to serially support blue, green, red LED chips (107B, 107G, 107R) which are first mass transferred from the respective substrates (152, 154, 156) using stamps 153. After the first mass transfer, the blue, green, red LED chips (107B, 107G, 107R) have their electrodes exposed, a pre-test before molding may be performed to screen out mal-functional LED chips. Next, the temporary substrate 150 attached with all blue, green, red LED chips (107B, 107G, 107R) in proper positions is then turned upside down to perform second mass transfer and mount all blue, green, red LED chips (107B, 107G, 107R) on a circuit board 158 for further molding with a transparent material layer 162 to be cut along dashed lines and tested. Only functional LED packages 100' are transferred and attached on a blue tape 200, and mal-functional LED packages 100' are screened out. It is noted that each LED package 100' includes a cut and divided circuit board 158. Each LED package 100 can be the LED packages (100b-100f) as discussed in previous embodiments. As shown in FIG. 11, functional LED packages 100 are then mounted on a division circuit board 301 and covered by an encapsulation layer 302 to form a divisional display module 300 of a complete LED display panel 400. In another embodiment, functional LED packages 100' may be mounted on a division circuit board 301 without an encapsulation layer 302. When a mini LED package 100 encapsulating at least one micro LED chip has a package size ranging from 100 micrometers to 1000 micrometers, mal-functional packages can easily be tested and screened out before mounting on a division circuit board. The divisional display module 300 with full functional LED packages 100' can be achieved. In another embodiment, the division circuit board 301 may include a system controller to control LED packages 100', e.g., using a system controller to control a pixel controller included in each LED package. The system controller may be mounted on a top surface 301a of the division circuit board 301 or on a bottom surface 301b of the division circuit board 301.

Figure 12:
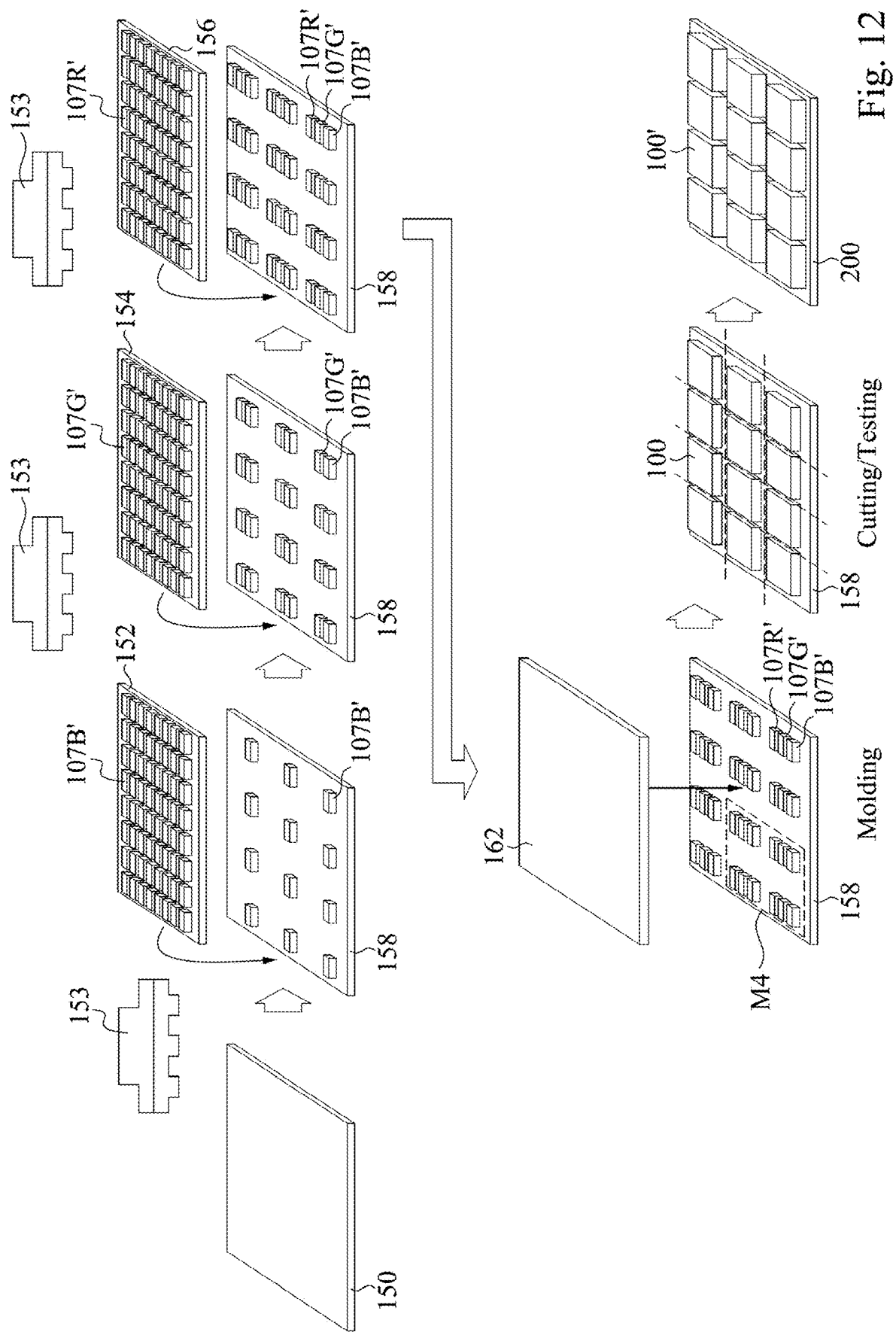
FIGS. 12-13 illustrate steps of manufacturing a light emitting diode display panel in accordance with another embodiment of the present invention.
Figure 13:
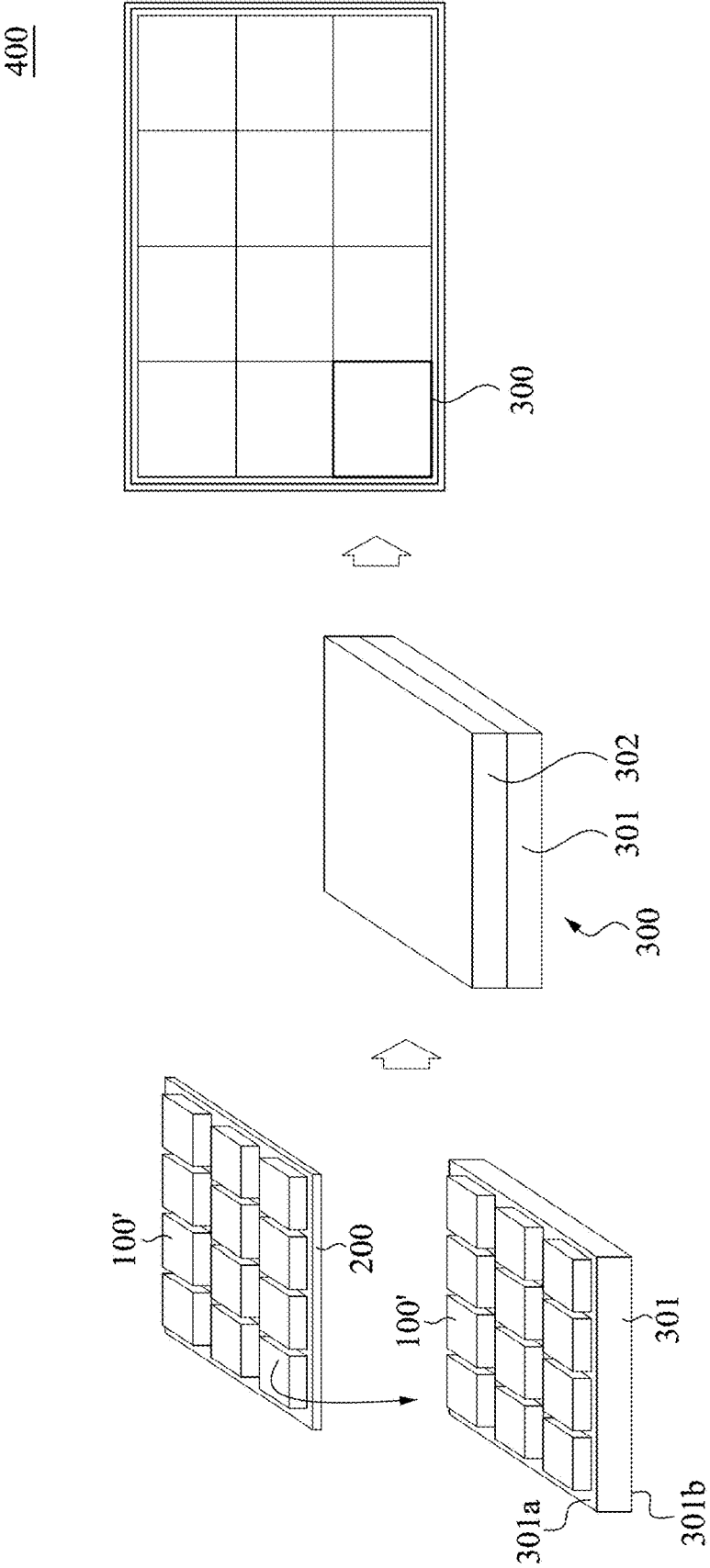

FIGS. 12-13 illustrate steps of manufacturing a light emitting diode display panel using the light emitting diode chip in FIG. 9. The steps in FIGS. 12-13 are different form steps in FIGS. 10-11 in that the micro LED chips, e.g., blue LED chips 107B', green LED chips 107G', and red LED chips 107R' are mass transferred from the respective substrates (152, 154, 156) directly to the circuit board 158 via a single mass transfer (e.g., using stamps 153) instead of two times mass transfers. Therefore, a pre-test before molding may not be performed on the LED chips, but the testing after molding are still available to screen out mal-functional LED packages before mounting on a division circuit board 301. In this embodiment, each LED package 100 include a set of blue LED chip 107B', green LED chip 107G', and red LED chip 107R'. In other embodiments, each LED package may include a pixel controller to control multiple sets of blue LED chips 107B', green LED chips 107G', and red LED chips 107R'. For example, as indicated by M4, 4 sets of blue LED chips 107B', green LED chips 107G', and red LED chips 107R' as well as a pixel controller may be packaged together to perform a predetermined function, but not being limited thereto. For example, 6, 9 or more sets of R, G, B LED chips may also be packaged together.

In sum, the mini LED package encapsulating at least one micro LED chip as disclosed herein are configured to offer higher luminance, a higher contrast ratio and reduce cross talks. In addition, the mini LED package encapsulating at least one micro LED chip facilitates easily testing the micro LED chips and screening out mal-functional ones before molding into a final display panel.

The present invention has been described in considerable detail with reference to certain embodiments thereof, other embodiments are possible. Therefore, the spirit and scope of the appended claims should not be limited to the description of the embodiments contained herein. It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims.

What is claimed is:

1. A light emitting diode (LED) package, comprising:
   a substrate having a width ranging from 100 micrometers to 1000 micrometers;
   at least one micro LED chip electrically mounted on a top surface of the substrate, the at least one micro LED chip having a width ranging from 1 micrometer to 100 micrometers;
   a black material layer covering the top surface of the substrate and exposing the at least one micro LED chip, wherein the black material layer comprises a black photoresist having a reflectivity smaller than 10%; and
   a transparent material layer covering the at least one micro LED chip and the black material layer,
   wherein a ratio of the width of the substrate to a thickness of the transparent material layer is equal to or greater than 4.

2. The LED package of claim 1, wherein the at least one micro LED chip has a thickness smaller than 10 micrometers.

3. The LED package of claim 1, wherein the at least one micro LED chip has a thickness substantially equal to that of the black material layer.

4. The LED package of claim 1, wherein the at least one micro LED chip comprises a light emitting surface having a first area, the top surface of the substrate has a second area, a ratio of the first area to the second area is equal to or smaller than 5%.

5. The LED package of claim 1, wherein the transparent material layer has the thickness smaller than 100 micrometers.

6. The LED package of claim 1, wherein the transparent material layer has an optical transmittance greater than or equal to 90%, 92%, or 95%.

7. The LED package of claim 1, wherein the transparent material layer has a top texture surface.

8. The LED package of claim 1, wherein the transparent material layer is a transparent dielectric layer or a transparent resin layer.

9. A light emitting diode (LED) package, comprising:
a substrate having a width;
at least one micro LED chip electrically mounted on a top surface of the substrate;
a black material layer covering the top surface of the substrate and exposing the at least one micro LED chip, wherein the black material layer comprises a black photoresist having a reflectivity smaller than 10%; and
a transparent material layer covering the at least one micro LED chip, the transparent material layer having a thickness, wherein a ratio of the width of the substrate to the thickness of the transparent material layer is equal to or greater than 4.

10. The LED package of claim 9, wherein the at least one micro LED chip has a thickness smaller than 10 micrometers, and the transparent material layer has a thickness smaller than 100 micrometers.

11. The LED package of claim 9, wherein the width of the substrate ranges from 400 micrometers to 1000 micrometers.

12. The LED package of claim 9, wherein the transparent material layer is a transparent dielectric layer or a transparent resin layer.

13. The LED package of claim 12, wherein the transparent dielectric layer comprises $SiO_2$, $Al_2O_3$, $TiO_2$, $Ta_2O_5$, $HfO_2$, $ZrO_2$, $Y_2O_3$, $MgF_2$ or $Si_3N_4$.

14. The LED package of claim 12, wherein the transparent dielectric layer is formed by a chemical vapor deposition process or an atomic layer deposition process.

* * * * *